United States Patent
Lee et al.

(10) Patent No.: US 7,800,413 B2
(45) Date of Patent: Sep. 21, 2010

(54) DIFFERENTIAL SIGNAL OUTPUT CIRCUIT FOR TIMING CONTROLLER OF DISPLAY DEVICE

(75) Inventors: Po-Ju Lee, Taipei County (TW);
Chien-Cheng Tu, Hsinchu (TW);
Cheng-Wei Chen, Taipei County (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 445 days.

(21) Appl. No.: 11/843,643

(22) Filed: Aug. 22, 2007

(65) Prior Publication Data
US 2008/0231329 A1  Sep. 25, 2008

(30) Foreign Application Priority Data
Mar. 22, 2007  (TW) .............................. 96109974 A (51) Int. Cl.
*H03B 1/00*  (2006.01)
(52) U.S. Cl. ...................... 327/108; 327/112; 327/391; 326/83
(58) Field of Classification Search ......... 327/108–112, 327/170, 389, 391; 326/26–27, 82–83
See application file for complete search history.

(56) References Cited

U.S. PATENT DOCUMENTS

| | | | | |
|---|---|---|---|---|
| 6,281,715 | B1 * | 8/2001 | DeClue et al. | 327/108 |
| 6,977,534 | B2 * | 12/2005 | Radelinow | 327/112 |
| 7,667,502 | B2 * | 2/2010 | Agarwal | 327/108 |

* cited by examiner

*Primary Examiner*—Long Nguyen
(74) *Attorney, Agent, or Firm*—Winston Hsu (57) ABSTRACT

A differential-signal output circuit for a timing controller of a display device includes a conversion circuit, a pre-charging circuit and a timing generator. The conversion circuit is used for receiving a differential signal and outputting a current to a load circuit according to polarity of the differential signal. The pre-charging circuit is coupled to a first output end and a second output end of the conversion circuit or is coupled to a first power driving end and a power second driving end of the conversion circuit. The pre-charging circuit is used for pre-charging the load according to a control signal. The timing generator is used for generating the differential signal and a control signal according to display data.

15 Claims, 13 Drawing Sheets

DIFFERENTIAL SIGNAL OUTPUT CIRCUIT FOR TIMING CONTROLLER OF DISPLAY DEVICE

BACKGROUND OF THE INVENTION

1. Field of the Invention

The present invention relates to differential-signal output circuits, and more particularly to a differential-signal output circuit with pre-charging functionality for a timing controller of a display device.

2. Description of the Prior Art

Liquid crystal display (LCD) devices are flat panel displays characterized by thin appearance, low radiation and low power consumption. Hence, LCD devices have gradually replaced traditional cathode ray tube (CRT) displays, and been widely applied in various electronic products such as notebook computers, personal digital assistants (PDAs), flat panel televisions, or mobile phones. An LCD device requires a driving system to drive an LCD panel, and the driving system usually includes a timing controller, a gate driver, and a source driver. The timing controller adopts differential signaling interfaces to transfer signals (data, control, clock signals) with the source driver and transfers the signals in a bus manner. Common differential signaling interfaces used in an LCD device include reduced swing differential signal (RSDS) interfaces, low voltage differential signal (LVDS) interfaces, and mini low voltage differential signal (mini-LVDS) interfaces, etc. To output differential signals, the timing controller utilizes a differential-signal output circuit outputting currents to terminal resistors inside the source drive by transmission lines. Voltage differences with different polarities are thereby generated across the terminal resistors, and are so called differential signals.

Figure 1:
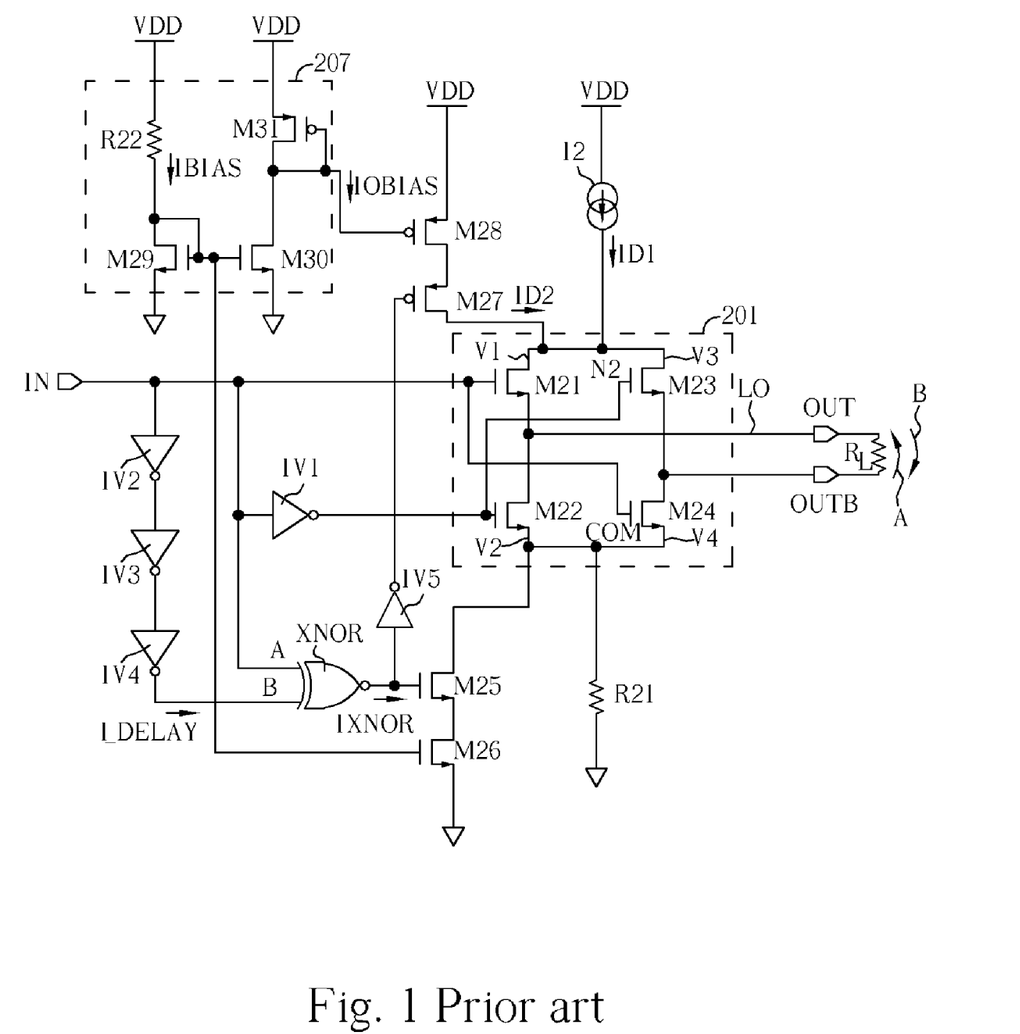
FIG. 1 is a schematic diagram of a differential-signal output circuit according to the prior art.
Figure 2:
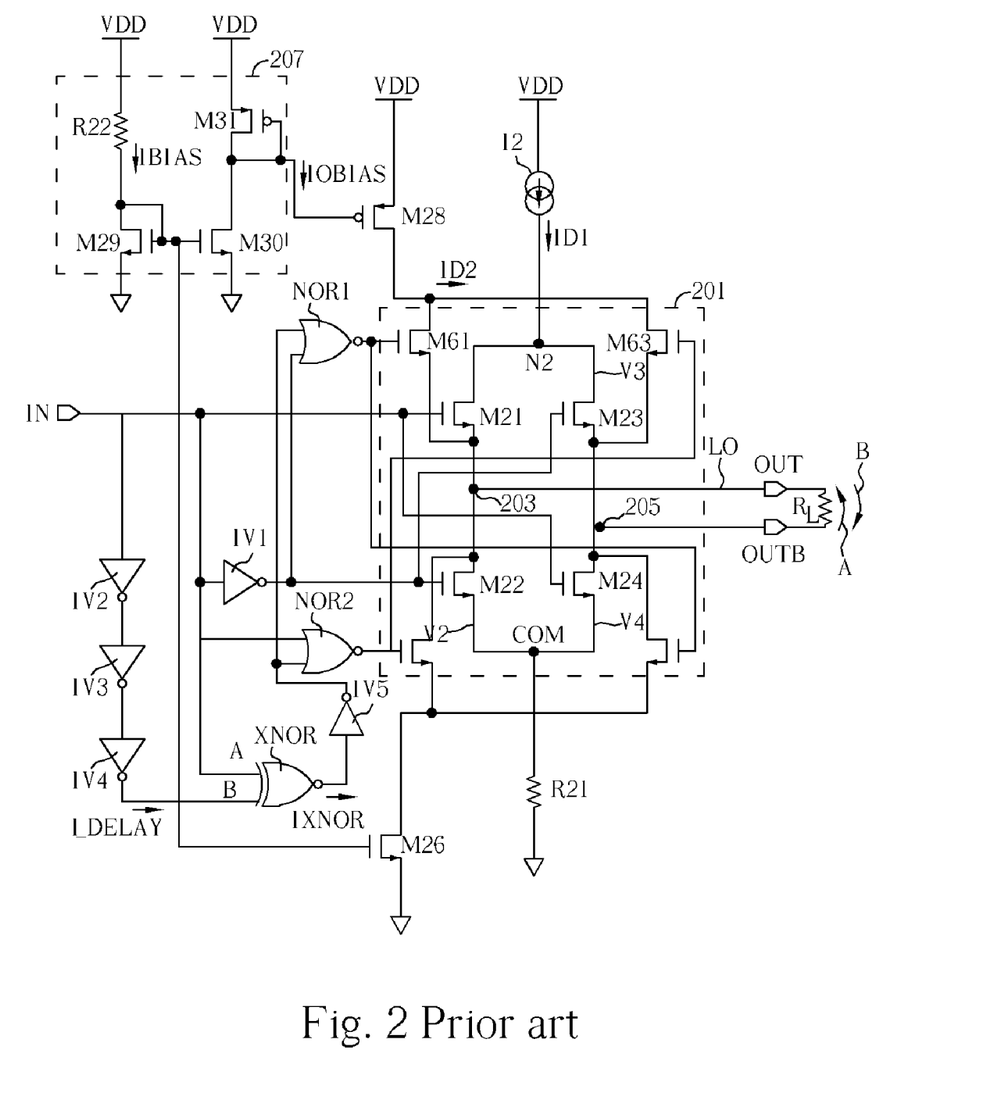
FIG. 2 is a schematic diagram of a differential-signal output circuit according to the prior art.

With advances of the LCD generation, the requirements for LCD sizes step into large scales and the resolution required is higher and higher. As a result, it is unavoidable to enhance operating speed of internal circuits of the LCD. A charging rate of a typical differential-signal output circuit appears insufficient. If the typical differential-signal output circuit is used in a large-size LCD, charging time of the load circuit may be too long to maintain correct data reception in the source driver. Therefore, to apply to large-size, high-speed LCD devices, U.S. Pat. No. 6,281,715, entitled "Low Voltage Differential Signal Driver with Pre-Emphasis Circuit", discloses a RSDS output circuit including a typical differential-signal output circuit, a pre-charging circuit and a bias circuit. The RSDS output circuit is used for pre-charging the load resistors in the source driver so as to enhance charging efficiency. Please refer to FIG. 1, which is a schematic diagram of the RSDS output circuit according to U.S. Pat. No. 6,281,715. In FIG. 1, the pre-charging circuit includes inverters IV1-IV5 and an exclusive-NOR gate XNOR, and thereby utilizes the inverters IV2, IV3 and IV4 to delay an input signal IN, so as to generate a pre-charging pulse signal IXNOR to control transistors M27 and M25. During transitions of transistors M21-M24, the transistors M27 and M25 switch on so that the pre-charging current ID2 is outputted to the load circuit $R_L$. In addition, U.S. Pat. No. 6,281,715 further discloses a RSDS output circuit shown in FIG. 2. The RSDS output circuit utilizes transistors M61-M64 to control a pre-charging current ID2 to enhancing pre-charging efficiency. In this patent, the RSDS output circuits both adopt the inverters to delay the input signal IN for an expected time. Thus, the pre-charging duration depends on the number of the inverters.

However, due to inverter manufacturing variation, the inverters in the RSDS output circuit may be slightly different in size. In this situation, the input signal IN may be delayed for different time when passing through each inverter, affecting the pre-charging duration. Beside, when the RSDS output circuit operates at different clock rates, inconsistent delay pulse-width ratios cause difficult delay control for the differential-signal output circuit. In this situation, the pre-charging current may pre-charge the load circuit at the wrong time.

SUMMARY OF THE INVENTION

It is therefore an objective of the present invention to provide a differential-signal output circuit that pre-charges a load circuit with control signals having adjustable phases for a timing controller of a display device.

The present invention discloses a differential-signal output circuit for a timing controller of a display device. The differential-signal output circuit includes a conversion circuit, a pre-charging circuit and a timing generator. The conversion circuit includes a first input terminal, a second input terminal, a first output terminal and a second output terminal. The conversion circuit is used for receiving a differential signal with the first input terminal and the second input terminal and outputting a current to a load circuit via the first output terminal and the second output terminal according to a polarity of the differential signal. The pre-charging circuit is coupled to the first output terminal and the second output terminal and is used for pre-charging the load circuit according to a control signal. The timing generator is coupled to the conversion circuit and the pre-charging circuit and is used for generating the differential signal and the control signal according to display data.

The present invention further discloses a differential-signal output circuit for a timing controller of a display device. The differential-signal output circuit includes a conversion circuit, a pre-charging circuit and a timing generator. The conversion circuit includes a first input terminal, a second input terminal, a first output terminal, a second output terminal, a first power driving terminal and a second power driving terminal. The conversion circuit is used for receiving driving power with the first power driving terminal and the second power driving terminal, receiving a differential signal with the first input terminal and the second input terminal, and outputting a current to a load circuit via the first output terminal and the second output terminal according to a polarity of the differential signal. The pre-charging circuit is coupled to the first power driving terminal and the second power driving terminal and is used for pre-charging the load circuit according to a control signal. The timing generator is coupled to the conversion circuit and the pre-charging circuit and is used for generating the differential signal and the control signal according to display data.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
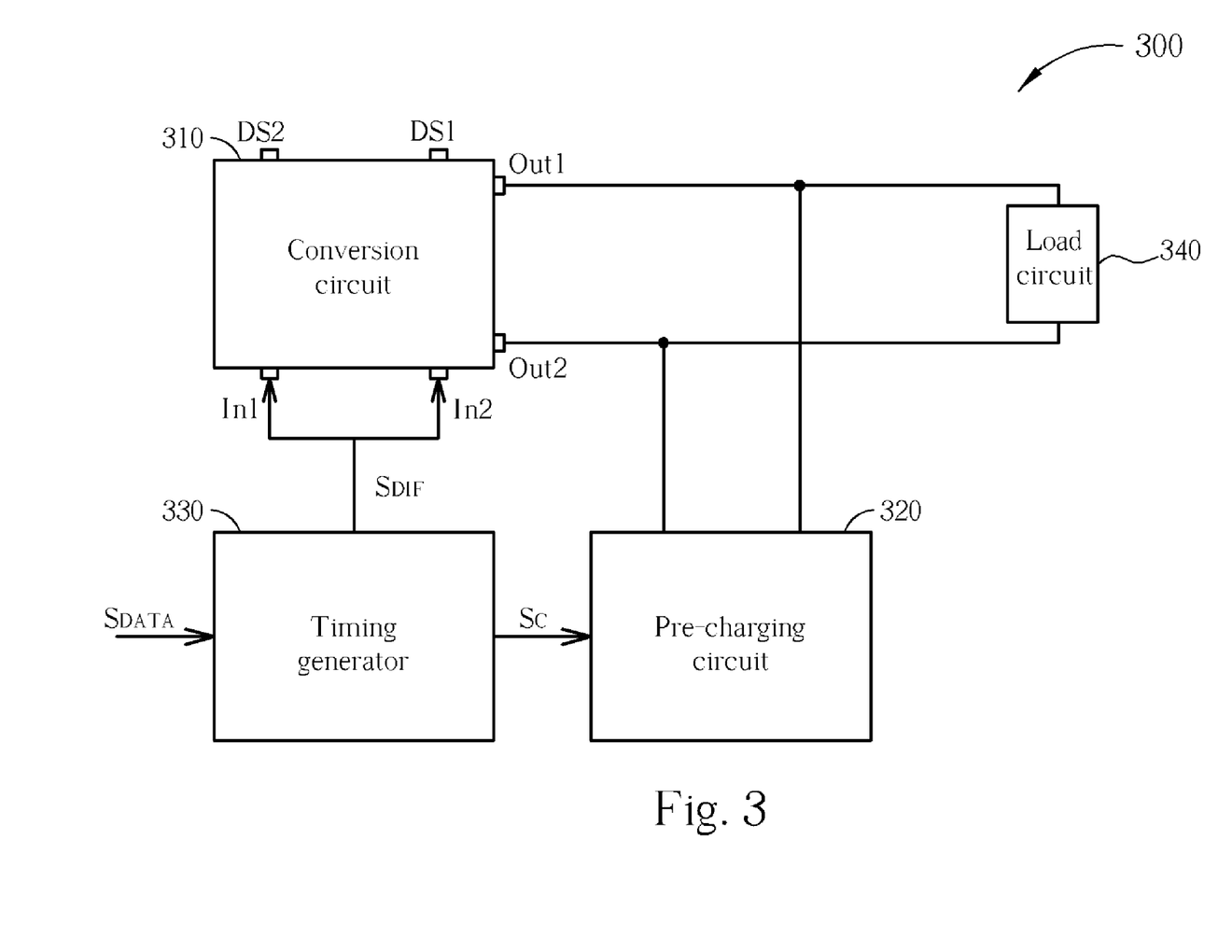
FIG. 3 is a schematic diagram of a differential-signal output circuit for a timing controller of a display device according to the present invention.

Please refer to FIG. 3, which is a schematic diagram of a differential-signal output circuit 300 for a timing controller of a display device according to the present invention. The differential-signal output circuit 300 includes a conversion circuit 310, a pre-charging circuit 320 and a timing generator 330. The timing generator 330 generates a differential signal $S_{DIF}$ and a control signal $S_C$ according to display data $S_{DATA}$. The conversion circuit 310 includes input terminals In1 and In2, output terminals Out1 and Out2, and power driving terminals Ds1 and Ds2. The conversion circuit 310 receives driving power with the power driving terminals Ds1 and Ds2. Moreover, the conversion circuit 310 receives the differential signal $S_{DIF}$ with the input terminals In1 and In2, and outputs a current to the load circuit 340 with the output terminals Out1 and Out2 according to polarity of the differential signal $S_{DIF}$. The pre-charging circuit 320 is coupled to the output terminals Out1 and Out2, and is used for pre-charging the load circuit 340 according to the control signal $S_C$ generated by the timing generator 330.

In the differential-signal output circuit 300, the timing generator 330 utilizes the differential signal $S_{DIF}$ and the control signal $S_C$ to control the conversion circuit 310 to output an expected current direction to the load circuit 340. The pre-charging circuit 320 then pre-charges the load circuit 340. For example, the timing generator 330 generates the differential signal $S_{DIF}$ having positive polarity and corresponding control signal $S_C$ according to the display data $S_{DATA}$, and further adjusts timing relationship of the differential signal $S_{DIF}$ and the control signal $S_C$. The conversion circuit 310 then outputs a current flowing from the output terminal Out1, through the load circuit 340 and back to the second output terminal Out2 according to the differential signal $S_{DIF}$ with the positive polarity. Meanwhile, according to the control signal $S_C$, the pre-charging circuit 320 also generates a current having the same direction as the current outputted by the conversion circuit 310. Before the conversion circuit 310 performs charging, the pre-charging circuit 320 generates the current to pre-charge the load circuit 340. Oppositely, as the differential signal $S_{DIF}$ is a negative-polarity signal, the conversion circuit 310 outputs a current flowing from the output terminal Out2, through the load circuit 340 and back to the first output terminal Out1. Accordingly, the pre-charging circuit 320 generates current with the same current direction to pre-charge the load circuit 340. Therefore, the differential-signal output circuit 300 utilizes the timing generator 330 to adjust the differential signal $S_{DIF}$ and the control signal $S_C$ so as to control output currents of the conversion circuit 310 and the pre-charging circuit 320 in the current directions and the timing relationship, precisely.

Please note that those skilled in the art can do modifications on the differential-signal output circuit 300 if necessary. Take a differential-signal output circuit adopting reduced swing differential signaling (RSDS) interface as example. Please refer to FIG. 4, which is a schematic diagram of a differential-signal output circuit 400 according to an embodiment of the present invention. The differential-signal output circuit 400 is used to realize the differential-signal output circuit 300 and includes a conversion circuit 410, a pre-charging circuit 420 and a timing generator 430. In the differential-signal output circuit 400, the timing generator 430 generates the differential signals N_IN and P_IN according to the display data $S_{DATA}$. The conversion circuit 410 outputs a current ID_1 to the load circuit 440 and controls a current direction of the current ID_1 according to the differential signals N_IN and P_IN. In addition, every time the conversion circuit 410 inverses the output current direction, the timing generator 430 generates control signals G1-G4 according to the display data $S_{DATA}$ and thereby controls the pre-charging circuit 420 to output a pre-charging current ID_2 or ID_3 to the load circuit 440.

Figure 4:
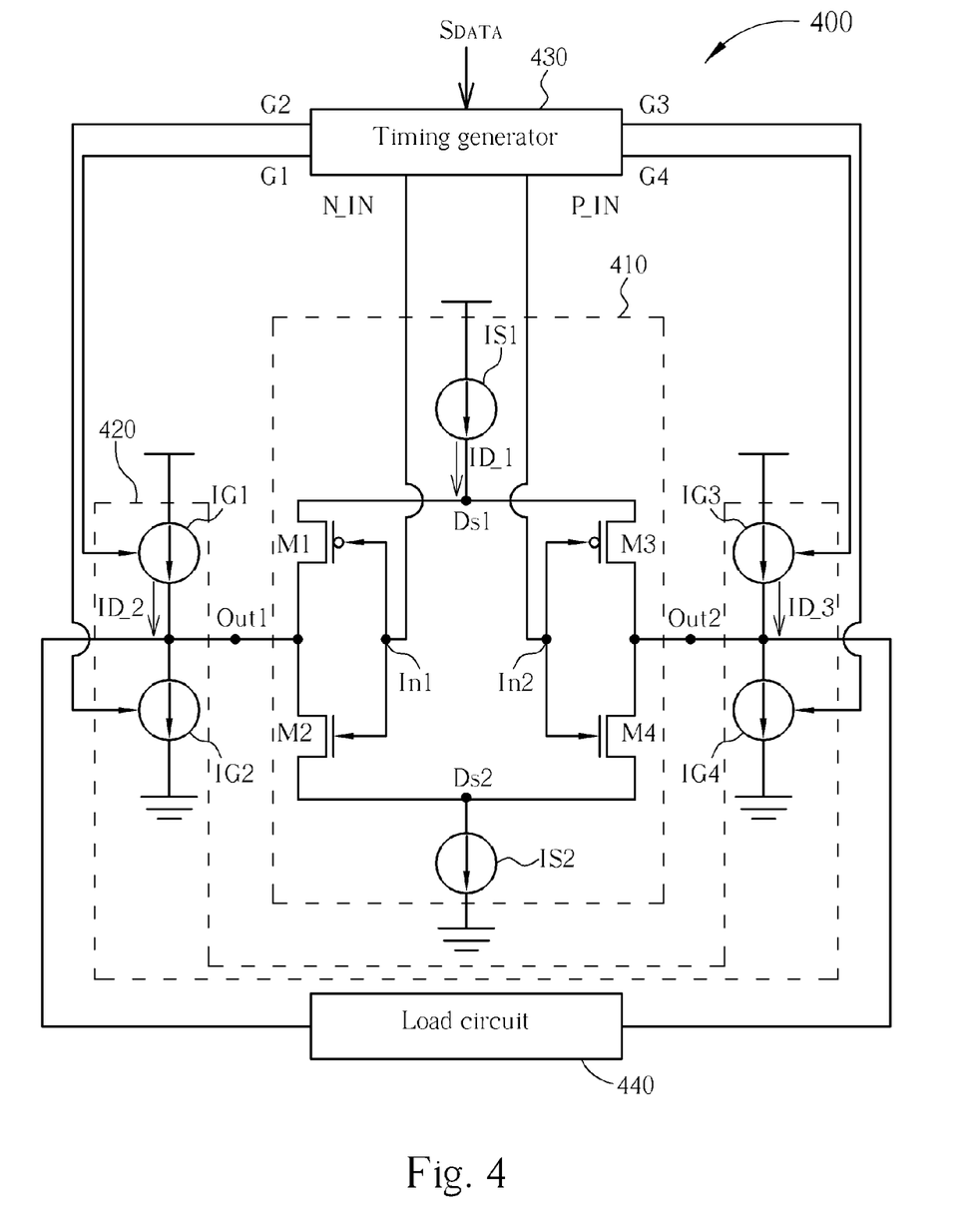
FIG. 4 is a schematic diagram of a differential-signal output circuit according to an embodiment of the present invention.

In general, the conversion circuit 410 is a RSDS output circuit without pre-charging functionality, and includes switch transistors M1-M4 and current sources IS1 and IS2. With cooperation of the switch transistor M1-M4, the conversion circuit 410 can control the current ID_1 provided by the current source IS1 to output from the output terminal Out1 or Out2. After that, the current ID_1 flows through a load circuit 440 and is absorbed by the current source IS2 at last. The switch transistors M1 and M2 form a complementary transistor inverter and the switch transistors M3 and M4 form another one. The switch transistors M1 and M3 are p-type metal oxide semiconductor transistors (MOSFET), whereas the switch transistors M2 and M4 are n-type metal oxide semiconductor transistor. The coupling relationship of the switch transistors M1-M4 is illustrated in FIG. 4. Thus, the switch transistors M1-M4 switch on or switch off according to the differential signals N_IN and P_IN outputted from the timing generator 430. As well known in the art, the differential signals N_IN and P_IN are complementary, such as when N_IN=1, P_IN=0 or when N_IN=0, P_IN=1. The differential signals N_IN and P_IN mainly function to control the switch transistors M1 and M4 and the switch transistors M2 and M3 to switch on or off simultaneously. As a result, the conversion circuit 410 can output the current ID_1 with an expected current direction to the load circuit 440. As the current ID_1 is expected to output from the output terminal Out1, N_IN is set to be 0 and P_IN is set to be 1 so that the switch transistors M1 and M4 switch on whereas the switch transistors M2 and M3 switch off. The current ID_1 then flows through the load circuit 440, the output terminal Out2, and the switch transistor M4 and is absorbed by the current source IS2 at last. Similarly, as the current ID_1s expected to output from the output terminal Out2, N_IN is set to be 1 and P_IN is set to be 0, thereby switching on the switch transistors M2 and M3 and simultaneously switching off the switch transistors M1 and M4. The current ID_1 then flows through the load circuit 440, the output terminal Out1 and the switch transistor M2, and is absorbed by the current source IS2.

The pre-charging circuit 420 is coupled to the output terminals Out1 and Out2 of the conversion circuit 410, and includes current sources IG1-IG4 used for outputting the pre-charging current ID_2 or ID_3 according to the control signals G1-G4 to pre-charge the load circuit 440. Preferably, the current sources IG1 and IG3 employ p-type MOSFETs to drive currents, and the current sources IG2 and IG4 are driven by n-type MOSFETs. As for the control signal G1-G4, the control signals G1 and G4 are a pair of complementary signals for activating the current sources IG1 and IG4 simultaneously whereas the control signals G2 and G3 are another pair of complementary signals for activating the current sources IG3 and IG2 simultaneously. As a result, when the current sources IG1 and IG4 turn on, a counterclockwise current loop is conducted, allowing the pre-charging current ID_2 to flow from the current source IG1, through the load circuit 440 and the current source IG4, and then into the ground. Similarly, when the current sources IG3 and IG2 turn on, a clockwise current loop is conducted for the pre-charging current ID_3. In few words, when the conversion circuit 410 changes the current direction according to the differential signals N_IN and P_IN, the timing generator 430 controls the current sources IG1-IG4 of the pre-charging circuit 420 with the control signals G1-G4. Hence, the load circuit 440 can rapidly be pre-charged to a predetermined voltage level with cooperation of the current sources, such as the current sources ID_2 and IS1 or ID_3 and IS1.

More specifically, the timing generator 430 generates the control signals G1-G4 to control output current timings of the conversion circuit 410 and the pre-charging circuit 420 according to signal transitions (a rising or falling edge) of the differential signals N_IN and P_IN. Please refer to FIG. 5, which is a schematic diagram of the timing generator 430 according to FIG. 4. The timing generator 430 includes a single-to-differential signaling module 510, a multiphase pulse generator 520 and a double switch controller 530, where the double switch controller 530 is called the DCS 530 hereinafter. The single-to-differential signaling module 510 receives the display data $S_{DATA}$ in sequence from and thereby outputs the complementary differential signals N_IN and P_IN to the conversion circuit 410 and the DSC 530. For more details of the timing generator 430, please refer to FIG. 6, which is a schematic diagram of the multiphase pulse generator 520 shown in FIG. 5. The multiphase pulse generator 520 includes a multiphase generator 610, a multiplexer 620 and a logic circuit 630, and is used for generating phase pulse signals F1 and F2 according to a delay control signal $S_{DL}$ and the display data $S_{DATA}$ to output to the DSC 530. In the multiphase pulse generator 520, the multiphase generator 610 could be a phase lock loop (PLL) or a delay lock loop (DLL) for generating the phase signals with precise phases. The multiplexer 620 selects phase signals PH1 and PH2, from the phase signals outputted by the multiphase pulse generator 520 according to the delay control signal $S_{DL}$. The logic circuit 630 includes logic gates, inverters and a D flip-flop, and the coupling relationship is illustrated in FIG. 6. The logic circuit 630 performs logic operations on the phase signals PH1 and PH2 and the display data $S_{DATA}$ to generate phase pulse signals F1 and F2. As known from the above, in the multiphase pulse generator 520, the multiphase generator 610 firstly generates multiple precise phase signals, and then the delay control signal $S_{DL}$ controls the multiplexer 620 to select a designate phase signal pair. Finally, the logic circuit 630 generates complementary phase pulse signals according to the signal waveforms of the display data $S_{DATA}$. Please refer to FIG. 7, which is a schematic diagram of the DSC 530 shown in FIG. 5. The DSC 530 includes a NOR gate 710, a NAND gate 720, a NOR gate 730, a NAND gate 740, and inverters 712, 722, 732 and 742. The DSC 530 performs logic operations on timings of the differential signals N_IN and P_IN and also the phase pulse signals F1 and F2 to generate the control signals G1-G4.

Figure 6:
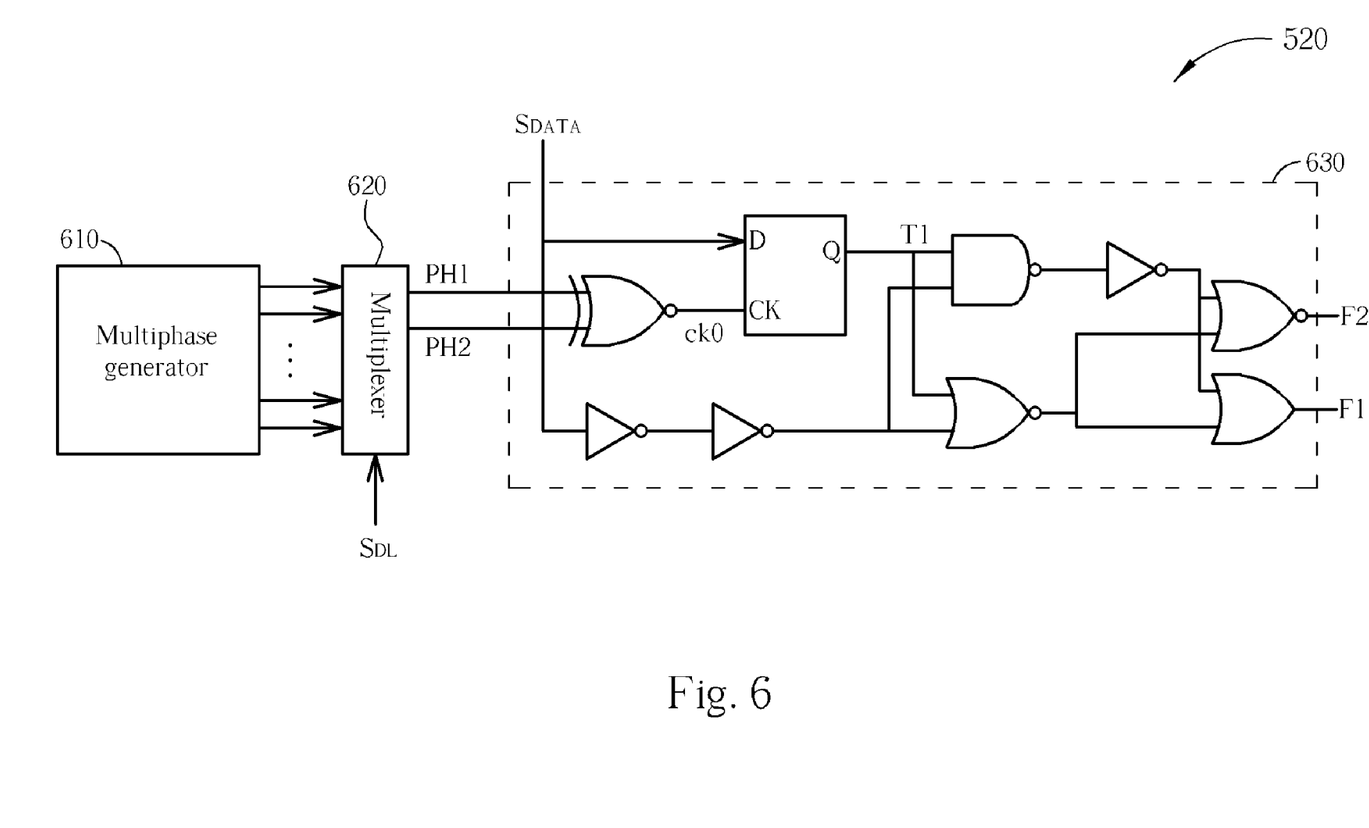
FIG. 6 is a schematic diagram of a multiphase pulse generator according to an embodiment of the present invention.
Figure 7:
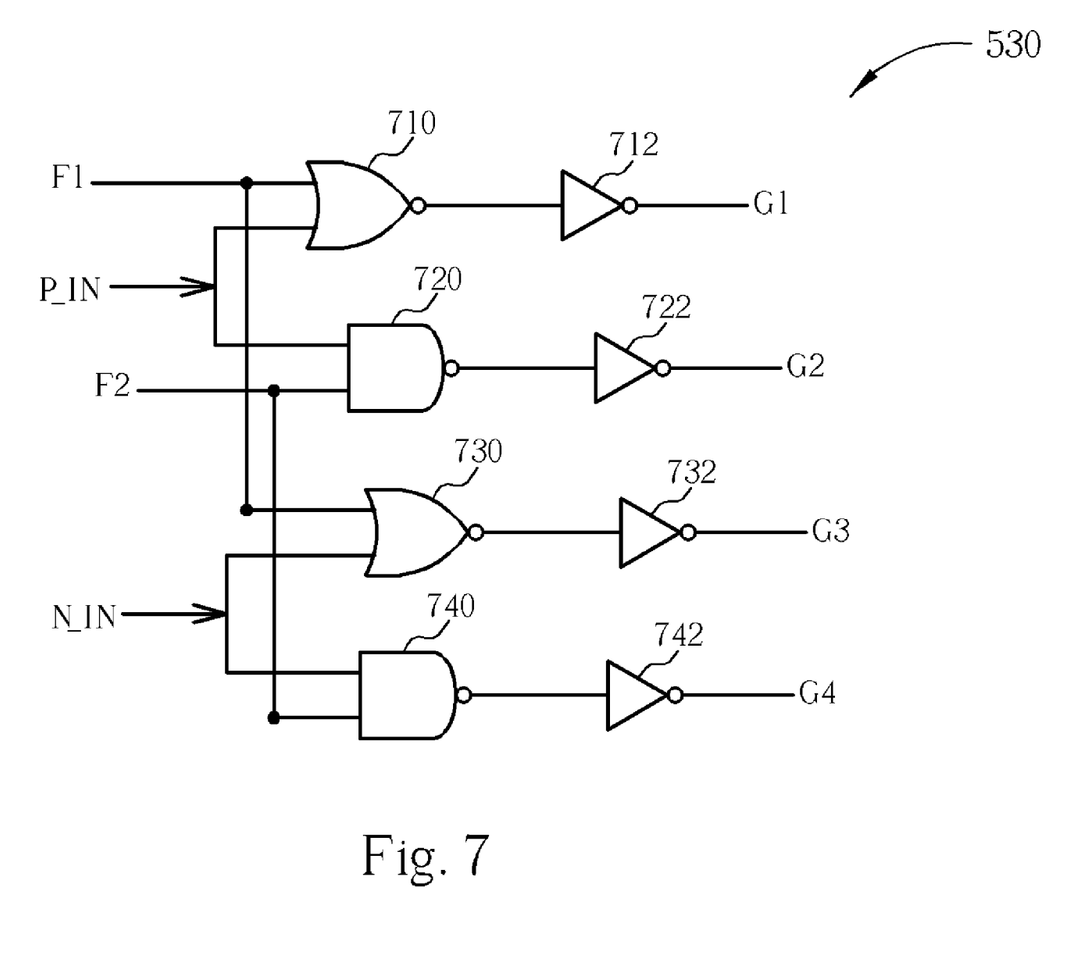
FIG. 7 is a schematic diagram of a double switch controller according to an embodiment of the present invention.

Please note that the multiphase pulse generator 520 of FIG. 6 and the DSC 530 of FIG. 7 are not limitations to the present inventions. Any embodiments are eligible if the embodiments can realize main functions of the timing generator 430 that precisely control timing and pre-charging duration of the phase pulse signals F1 and F2 and the control signals G1-G4.

Figure 8:
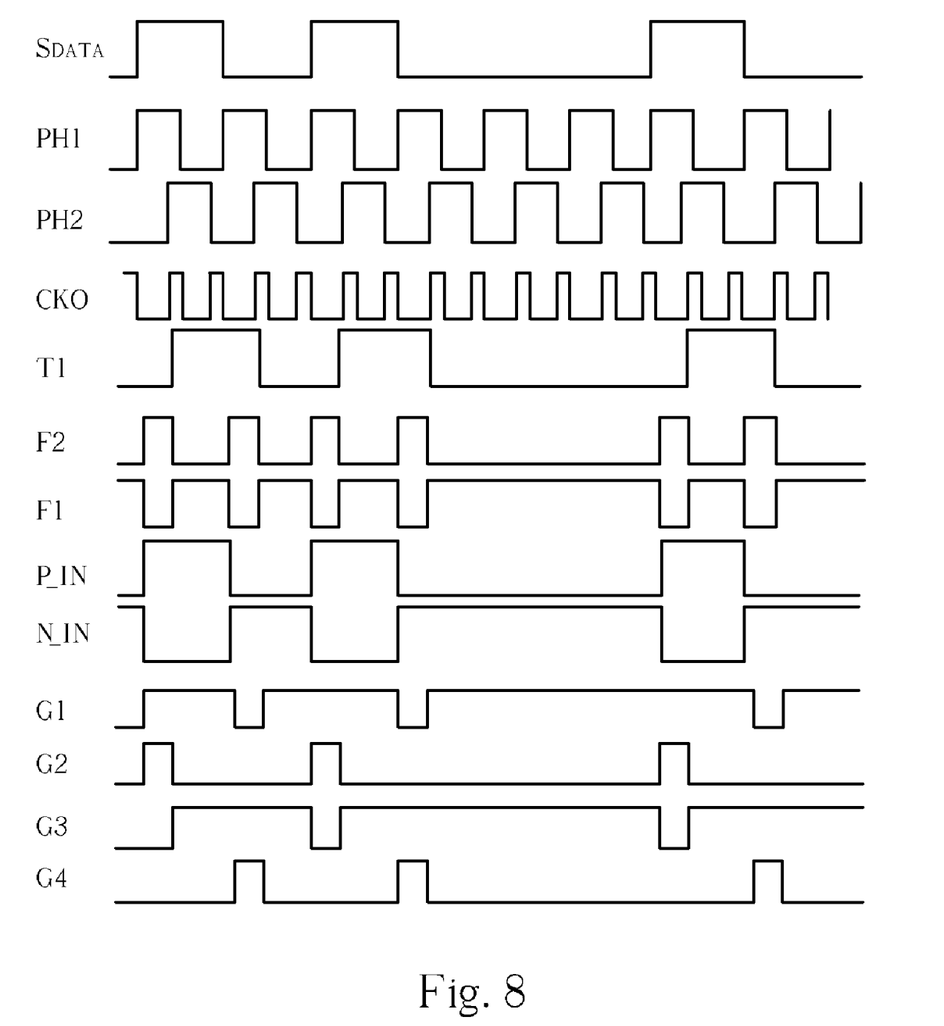
FIG. 8 is a schematic diagram of signal waveforms of the differential-signal output circuit according to FIG. 4.

Thus, the differential-signal output circuit 400 utilizes the timing generator 430 to generate the control signals G1-G4 with phase difference to control the output current timing relationship between the conversion circuit 410 and the pre-charging circuit 420. Please refer to FIG. 8, which is a schematic diagram of signal waveforms of the differential-signal output circuit 400. From top to bottom, the corresponding signals of differential-signal output circuit 400 are the display data $S_{DATA}$, the phase signals PH1 and PH2, a clock signal CKO of the D flip-flop in the logic circuits 630, an output signal T1 of the D flip-flop in the logic circuits 630, the phase pulse signals F2 and F1, the differential signals N_IN and P_IN, and the control signals G1-G4. As illustrated in FIG. 8, the phase signals PH1 and PH2 determine pulse widths of the phase pulse signals F1 and F2, whereas the pulse widths determine pre-charging duration for the pre-charging circuit 420. The control signals G1-G4 form two complementary signal pairs on a basis of pulse widths of the phase pulse signals F1 and F2 and clock edges of the differential signals P_IN and N_IN. The control signals G1 and G4 are complementary, and so are the control signals G2 and G3. In addition, the control signals G1-G4 respectively control the current sources IG1-IG4 of the pre-charging circuit 420. Preferably, the current sources IG1 and IG3 are driven by p-MOSFETs, whereas the current sources IG2 and IG4 are driven by n-MOSFETs. Thus, according to FIG. 8, the control signals G1 and G4 turn on the current sources IG1 and IG4 simultaneously, allowing the pre-charging current ID_2 to pre-charge the load circuit 440 in a counterclockwise loop. On the other hand, the control signals G2 and G3 turn on the current sources IG2 and IG3 simultaneously, allowing the pre-charging current ID_3 to pre-charge the load circuit 440 in a clockwise loop.

Figure 9:
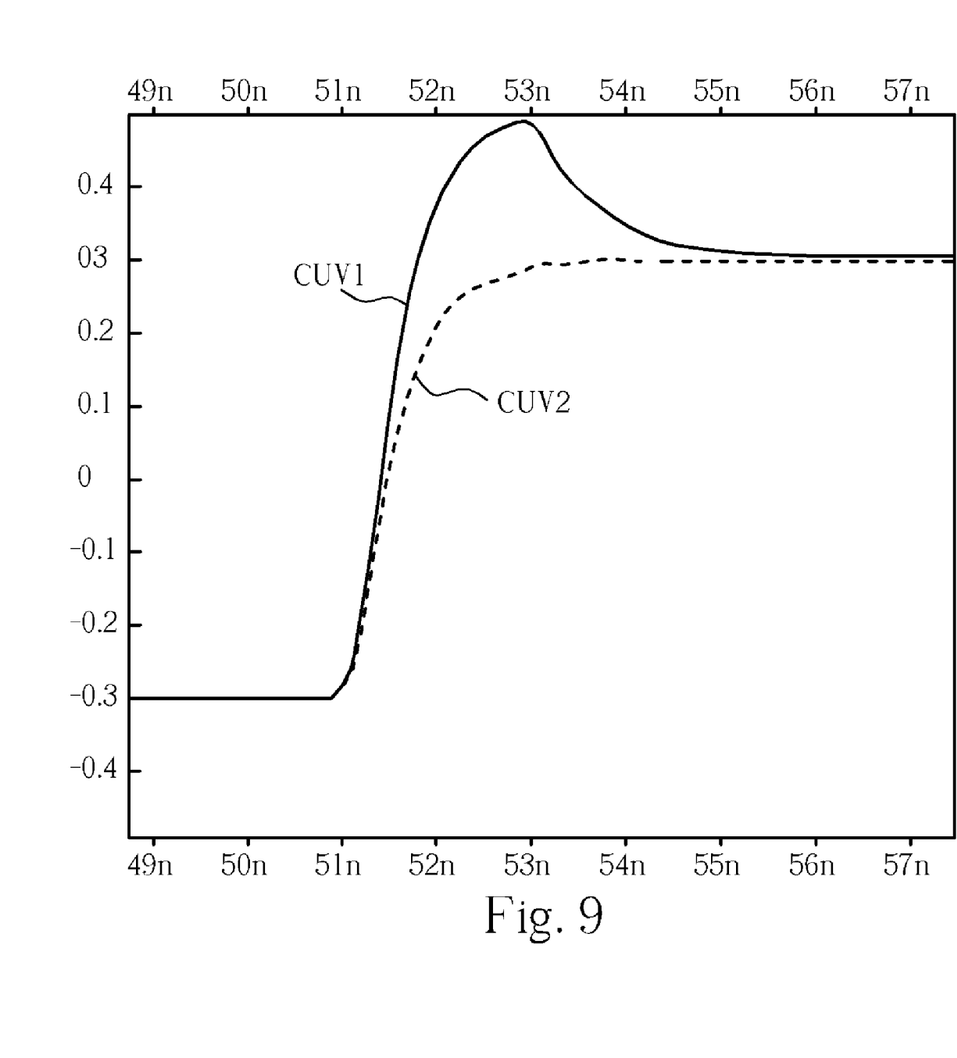
FIG. 9 is a schematic diagram of charging waveforms of the differential-signal output circuit according to FIG. 4 and the prior art
Figure 10:
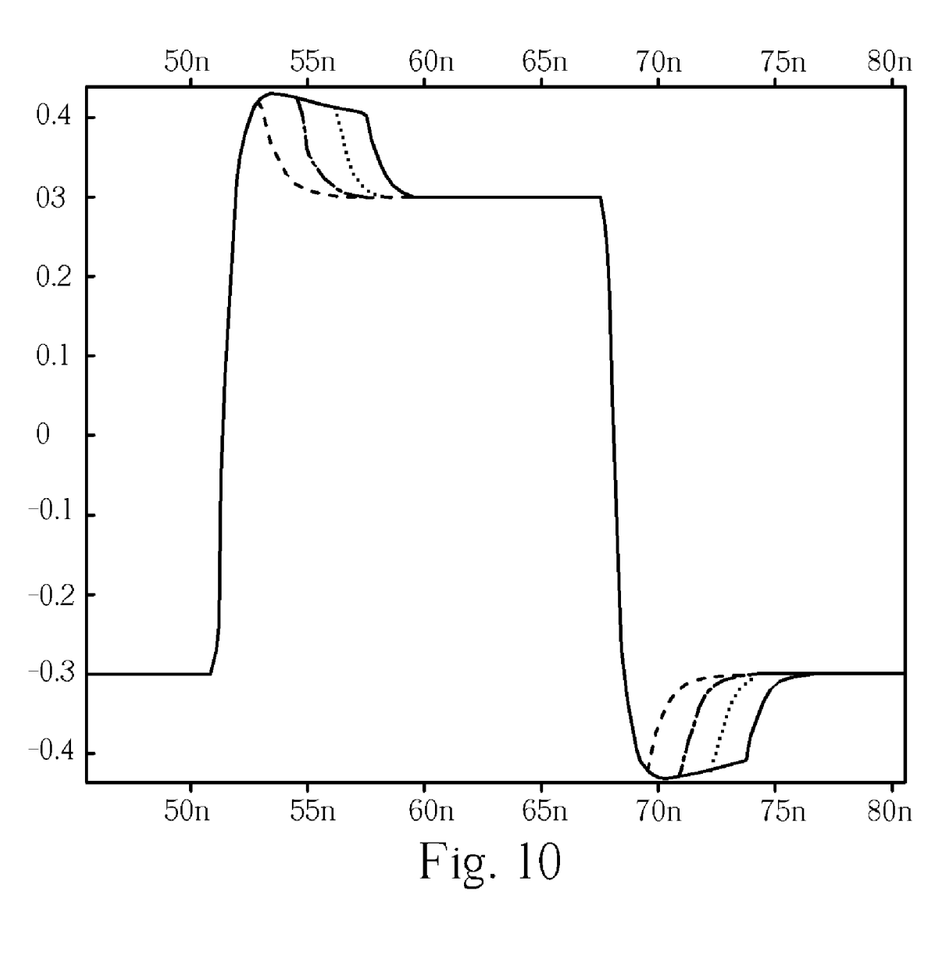
FIG. 10 is a schematic diagram of charging waveforms of the differential-signal output circuit under different pre-charging durations according to FIG. 4.

Please refer to FIGS. 9 and 10. FIG. 9 is a schematic diagram of charging waveforms of the differential-signal output circuit according to FIG. 4 and the prior art, and FIG. 10 is a schematic diagram of charging waveforms of the differential-signal output circuit 400 under different pre-charging durations. In FIG. 9, a waveform CUV1 is used for charging the load circuit 440 with pre-charge by the pre-charging circuit 420, while a waveform CUV2 is a waveform charging the load circuit 440 without pre-charge. The waveform CUV2 is a charging result that only the conversion circuit 410 charges the load circuit 440. In FIG. 10, by adjusting the pulse widths of the phase pulse signals F1 and F2, the control signals G1-G4 are accordingly modified, producing different pre-charging waveforms.

To summarize the above, the differential-signal output circuit 400 installs the pre-charging circuit 420 on the output terminals Out1 and Out2 of the conversion circuit 410. Besides, the timing generator 430 generates the control signals G1-G4 to control operating timing between the pre-charging circuit 420 and the conversion circuit 410 so that the load circuit 440 can be pre-charged at the right time and for a precise duration.

Figure 11:
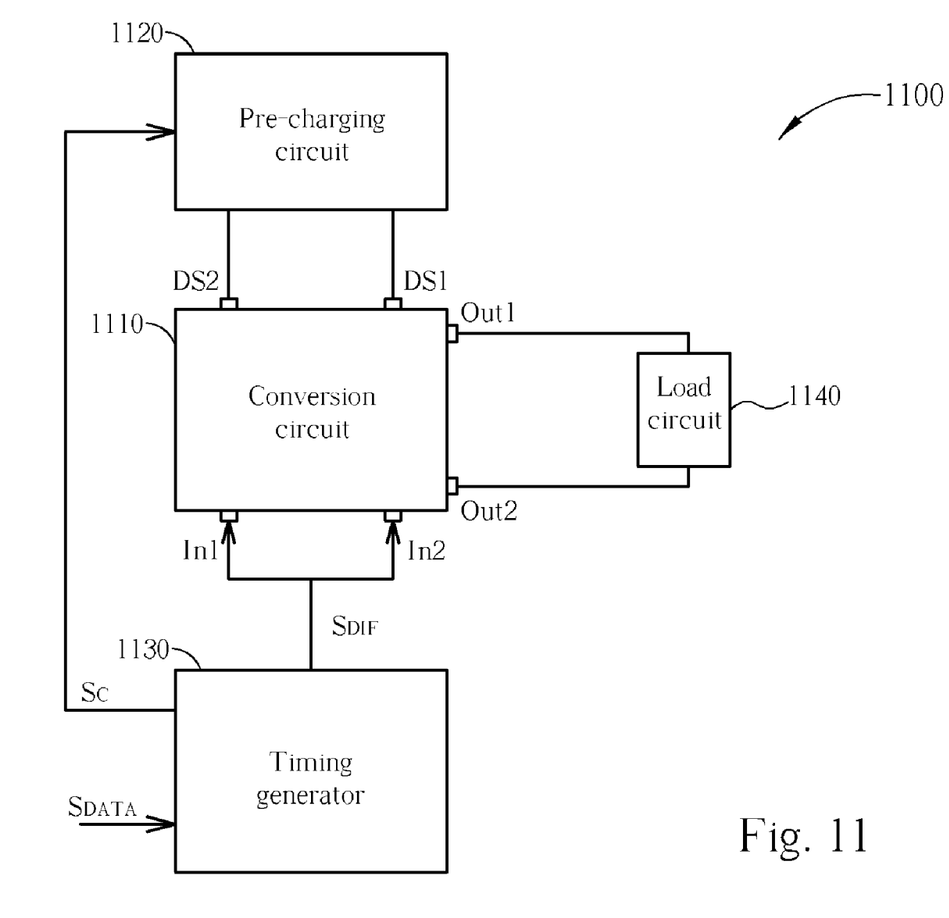
FIG. 11 is a schematic diagram of a differential-signal output circuit for a timing controller of a display device according to the present invention.

Please refer to FIG. 11, which is a schematic diagram of a differential-signal output circuit 1100 according to the present invention. Compared to the differential-signal output circuit 300 shown in FIG. 3, the differential-signal output circuit 1100 is similar to the differential-signal output circuit 300 and includes a conversion circuit 1110, a pre-charging circuit 1120 and a timing generator 1130. The difference is that the pre-charging circuit 1120 is not installed on the output terminals Out1 and Out2 of the conversion circuit 1110, but on the power driving terminals Ds1 and Ds2. In such architecture, the pre-charging circuit 1120 outputs or drains currents from the power driving terminals Ds1 and Ds2 according to a control signal $S_C$ generated by the timing generator 1130, thereby enhancing reaction speed of the conversion circuit 1110 as well as speed of driving the load circuit 1140.

In the differential-signal output circuit 1100, the timing generator 1130 generates a differential signal $S_{DIF}$ and the control signal $S_C$ according to the display data $S_{DATA}$, so as to control the current outputted from the conversion circuit 1110 to the load circuit 1140. To achieve pre-charge for the load circuit 1140, the pre-charging circuit 1120 provides the conversion circuit 1110 with extra current. For example, the timing generator 1130 generates the differential signal $S_{DIF}$ having positive polarity and corresponding control signal $S_C$ according to the display data $S_{DATA}$, and further adjusts timing relationship of the differential signal $S_{DIF}$ and the control signal $S_C$. According to the positive-polarity differential signal $S_{DIF}$, the conversion circuit 1110 outputs the current that flows from the output terminal Out1, through the load circuit 1140 and then to the output terminal Out2. Meanwhile, according to the control signal $S_C$, the pre-charging circuit 1120 generates a pre-charging current to the power driving terminal Ds1 and drains current from the power driving terminal Ds2, so as to enhance reaction speed of the conversion circuit 1110. On the contrary, as the differential signal $S_{DIF}$ appears as a negative-polarity signal, the conversion circuit 1110 outputs a current that flows from the output terminal Out2, through the load circuit 1140, and then to the output terminal Out1. The pre-charging circuit 1120 generates the pre-charging current to the power driving terminal Ds2 and drains current from the power driving terminal Ds1. Therefore, the differential-signal output circuit 1100 utilizes the timing generator 1130 to adjust the differential signal $S_{DIF}$ and the control signal $S_C$, so as to control output current directions and timings of the conversion circuit 1110 and the pre-charging circuit 1120, precisely.

Please note that those skilled in the art can do modifications on the differential-signal output circuit 1100. Take a differential-signal output circuit with RSDS interface for example. Please refer to FIG. 12, which is a schematic diagram of a differential-signal output circuit 1200 according to an embodiment of the present invention. The differential-signal output circuit 1200 is utilized to realize the differential-signal output circuit 1100, and includes a conversion circuit 1210, a pre-charging circuit 1220 and a timing generator 1230, where the conversion circuit 1210 is the same as the conversion circuit 410 shown in FIG. 4. The pre-charging circuit 1220 includes current sources IG1 and IG2 that are coupled to sources of the switch transistors M1 and M2, respectively. Moreover, the current sources IG1 and IG2 respectively control the current sources IG1 and IG2 according to the control signals G1' and G2', prompting a pre-charging current ID_2 to pre-charge the load circuit 1240 timely and accurately. The current sources IG1 and IG2 could be driven by a P-MOSFET and a N-MOSFET, respectively. Hence, in the differential-signal output circuit 1200, the pre-charging current ID_2 flows to the load circuit 1240 through the switch transistors M1 and M4 as well as a clockwise loop or through the switch transistors M3 and M2 as well as a counterclockwise loop. At last, the pre-charging current ID_2 flows back into the current source IG2.

Figure 5:
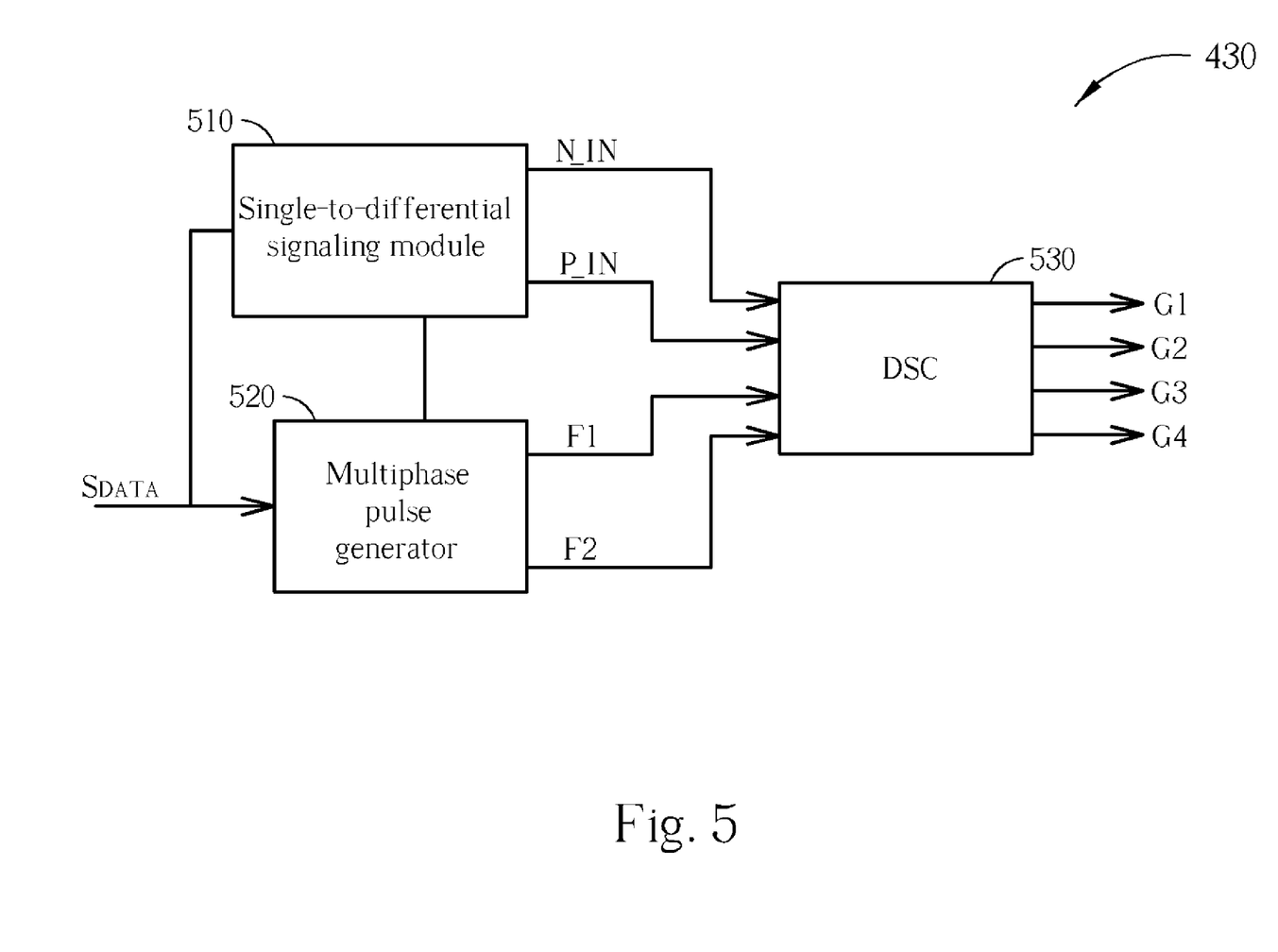
FIG. 5 is a schematic diagram of a timing generator according to an embodiment of the present invention.
Figure 12:
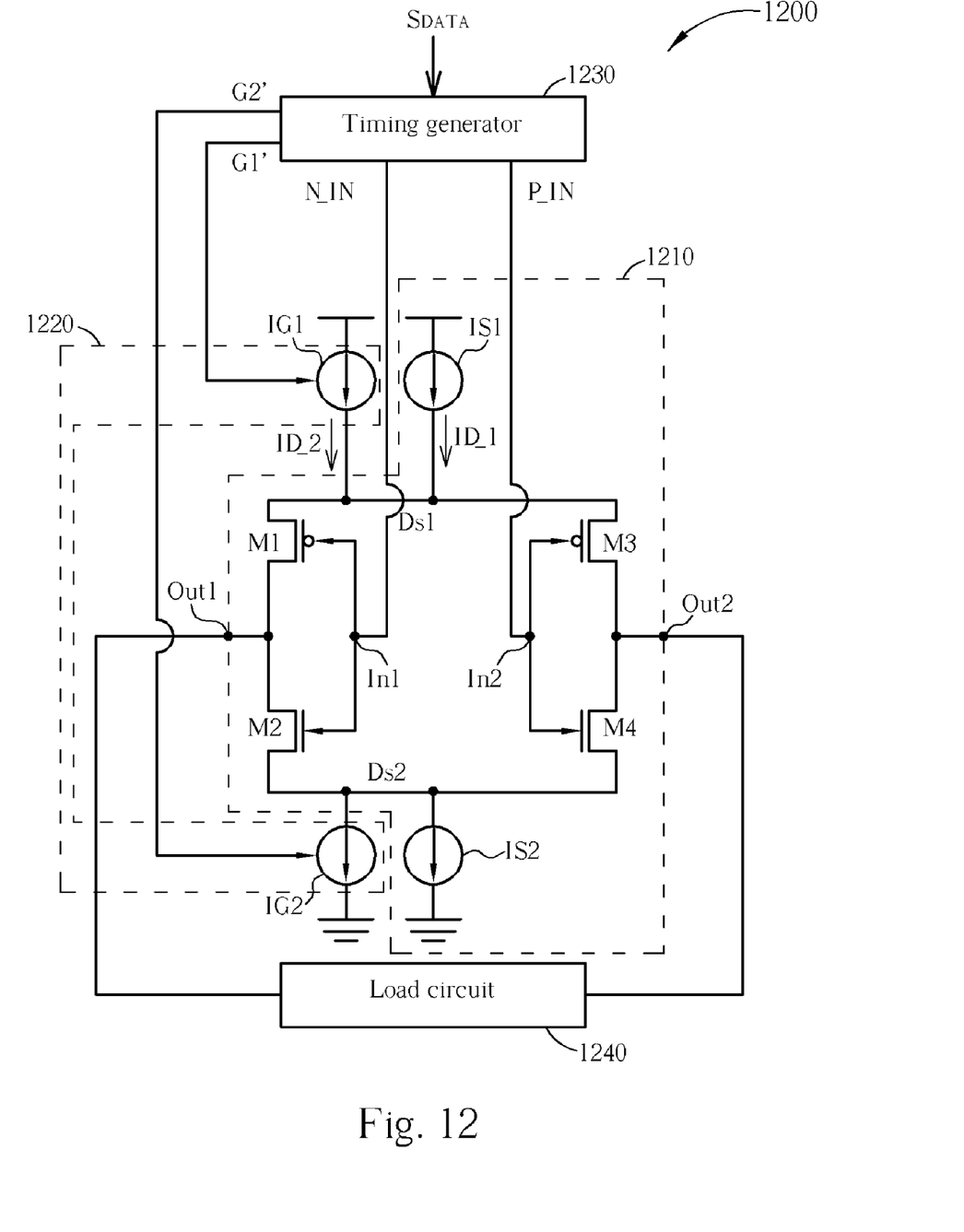
FIG. 12 is a schematic diagram of a differential-signal output circuit according to an embodiment of the present invention.
Figure 13:
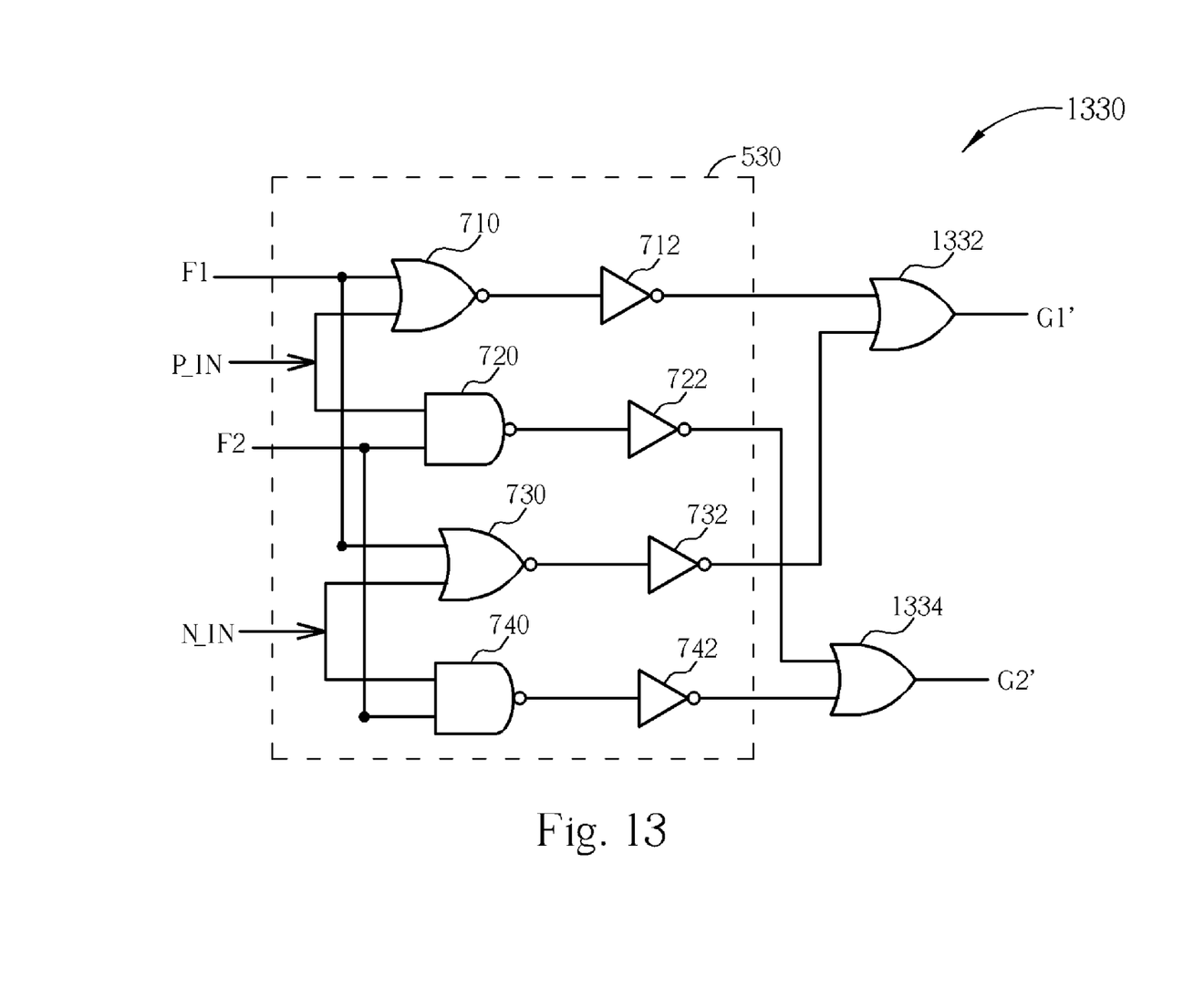
FIG. 13 is a schematic diagram of a double switch controller according to an embodiment of the present invention.

In addition, the devices inside the timing generator 1230 have the same coupling relationship as those inside the timing generator 430 of FIG. 5. However, the pre-charging circuit 1220 only employs two current sources, IG1 and IG2, so that the DSC 530 needs to be modified. Please refer to FIG. 13, which is a schematic diagram of a DSC 1330 of the timing generator 1230. The DSC 1330 adds OR gates 1332 and 1334 at the outputs of the DSC 530 as well as the control signals G1-G4. As a result, the DSC 1330 performs an OR logic operation on the control signals G1 and G3 and also on the control signals G2 and G4, so as to generate the control signals G1' and G2'. Compared to the differential-signal output circuit 400, the differential-signal output circuit 1200 installs the pre-charging circuit 1220 to couple to the conversion circuit 1210. Under control of the timing generator 1230, the pre-charging current ID_2 flows through the conversion circuit 1210 to pre-charge the load circuit 1240.

In conclusion, according to the prior art, the differential-signal output circuit controls the pre-charging duration according to the number of the inverters, easily resulting in duration variation due to slight size difference between the inverters. Compared with the prior art, the present invention provides a timing generator capable of generating control signals with adjustable phases in high or low rate operation to control the pre-charging circuit, eliminating the uncontrolled affects from manufacturing-process. Therefore, the pre-charging duration can be modified precisely and flexibly in the present invention.

Those skilled in the art will readily observe that numerous modifications and alterations of the device and method may be made while retaining the teachings of the invention.

What is claimed is:

1. A differential-signal output circuit for a timing controller of a display device, the differential-signal output circuit comprising:
  a conversion circuit comprising a first input terminal, a second input terminal, a first output terminal and a second output terminal, the conversion circuit being used for receiving a differential signal with the first input terminal and the second input terminal and outputting a current to a load circuit via the first output terminal and the second output terminal according to a polarity of the differential signal;
  a pre-charging circuit coupled to the first output terminal and the second output terminal, for pre-charging the load circuit according to a control signal; and
  a timing generator coupled to the conversion circuit and the pre-charging circuit, for generating the differential signal and the control signal according to display data, the timing generator comprising:
    a single-to-differential signaling module for generating the differential signal according to the display data and outputting the differential signal to the conversion circuit;
    a multiphase pulse generator for generating a plurality of phase pulse signals according to a delay control signal and the display data; and
    a double switch controller coupled to the single-to-differential signaling module and the multiphase pulse generator, for generating the control signal according to the differential signal and the plurality of phase pulse signals.

2. The differential-signal output circuit of claim 1, wherein the conversion circuit comprises:
- a first transistor comprising a first terminal coupled to the first output terminal, a second terminal coupled to the first input terminal, and a third terminal coupled to a first power driving terminal;
- a second transistor comprising a first terminal coupled to the first output terminal, a second terminal coupled to the first input terminal, and a third terminal coupled to a second power driving terminal;
- a third transistor comprising a first terminal coupled to the second output terminal, a second terminal coupled to the second input terminal, and a third terminal coupled to the first power driving terminal; and
- a fourth transistor comprising a first terminal coupled to the second output terminal, a second terminal coupled to the second input terminal, and a third terminal coupled to the second power driving terminal.

3. The differential-signal output circuit of claim 2, wherein the first transistor is a p-type metal oxide semiconductor transistor, where the first terminal of the first transistor is a drain, the second terminal of the first transistor is a gate, and the third terminal of the first transistor is a source.

4. The differential-signal output circuit of claim 2, wherein the second transistor is an n-type metal oxide semiconductor transistor, where the first terminal of the second transistor is a drain, the second terminal of the second transistor is a gate, and the third terminal of the second transistor is a source.

5. The differential-signal output circuit of claim 2, wherein the third transistor is a p-type metal oxide semiconductor transistor, where the first terminal of the third transistor is a drain, the second terminal of the third transistor is a gate, and the third terminal of the third transistor is a source.

6. The differential-signal output circuit of claim 2, wherein the fourth transistor is an n-type metal oxide semiconductor transistor, where the first terminal of the fourth transistor is a drain, the second terminal of the fourth transistor is a gate, and the third terminal of the fourth transistor is a source.

7. The differential-signal output circuit of claim 1, wherein the pre-charging circuit comprises:
- a first current source coupled to the first output terminal of the conversion circuit;
- a second current source coupled to the first output terminal of the conversion circuit;
- a third current source coupled to the second output terminal of the conversion circuit; and
- a fourth current source coupled to the second output terminal of the conversion circuit.

8. The differential-signal output circuit of claim 7, wherein the timing generator generates the control signal to switch on the first current source and the fourth current source simultaneously or to switch on the second current source and the third current source simultaneously.

9. The differential-signal output circuit of claim 1, wherein the multiphase pulse generator comprises:
- a multiphase generator for generating a plurality of phase signals;
- a multiplexer coupled to the multiphase generator, for selecting a pair of phase signals from the plurality of phase signals according to the delay control signal; and
- a logic circuit coupled to the multiplexer, for generating the plurality of phase pulse signals according to the pair of phase signals and the display data.

10. The differential-signal output circuit of claim 9, wherein the multiphase pulse generator is a phase lock loop or a delay lock loop.

11. The differential-signal output circuit of claim 9, wherein the logic circuit comprises:
- an exclusive-or (XOR) gate coupled to the multiplexer, for outputting an XOR operation result of the pair of phase signals;
- a D flip-flop comprising an input terminal for receiving the display data, a clock input terminal for receiving the XOR operation result of the pair of phase signals, and an output terminal;
- a sequence of inverters comprising an output terminal and a plurality of inverters cascaded in a sequence, the sequence of inverters being used for delaying the display data and outputting a delay result of the display data with the output terminal;
- a NAND gate comprising a first input terminal coupled to the output terminal of the D flip-flop, a second input terminal coupled to the output terminal of the sequence of inverters, and an output terminal;
- a first NOR gate comprising a first input terminal coupled to the output terminal of the D flip-flop, a second terminal coupled to the output terminal of the sequence of inverters, and an output terminal;
- an inverter comprising an input terminal coupled to the output terminal of the NAND gate, and an output terminal;
- a second NOR gate comprising a first input terminal coupled to the output terminal of the inverter, a second input terminal coupled to the output terminal of the first NOR gate, and an output terminal; and
- an OR gate comprising a first input terminal coupled to the output terminal of the inverter, a second terminal coupled to the output terminal of the first NOR gate, and an output terminal.

12. The differential-signal output circuit of claim 1, wherein the double switch controller comprises:
- a first NOR gate comprising a first input terminal for receiving a first phase pulse signal of the plurality of phase pulse signals, a second terminal for receiving a first polarity signal of the differential signal, and an output terminal;
- a first inverter coupled to the output terminal of the first NOR gate, for outputting a first control signal of the control signal;
- a first NAND gate comprising a first input terminal for receiving the first polarity signal of the differential signal, a second input terminal for receiving a second phase pulse signal of the plurality of phase pulse signals, and an output terminal;
- a second inverter coupled to the output terminal of the first NAND gate, for outputting a second control of the control signal;
- a second NOR gate comprising a first input terminal for receiving the first phase signal of the plurality of phase signals, a second input terminal for receiving a second polarity signal of the differential signal, and an output terminal;
- a third inverter coupled to the output terminal of the second NOR gate, for outputting a third control signal of the control signal;
- a second NAND gate comprising a first input terminal for receiving the second polarity signal of the differential signal, a second input terminal for receiving the second phase pulse signal of the plurality of phase pulse signals, and an output terminal; and a fourth inverter coupled to the output terminal of the second NAND gate, for outputting a fourth control signal of the control signal.

13. The differential-signal output circuit of claim 12, wherein the first phase pulse signal and the second phase pulse signal are complementary.

14. The differential-signal output circuit of claim 12, wherein the first control signal and the fourth control signal are complementary, and the second control signal and the third control signal are complementary.

15. The differential-signal output circuit of claim 1, wherein the conversion circuit further comprises a first power driving terminal and a second power driving terminal which are both used for receiving power for the conversion circuit.

* * * * *